United States Patent [19]

Dünnebacke

[11] Patent Number: 4,682,364

[45] Date of Patent: Jul. 21, 1987

[54] FADER CIRCUIT ARRANGEMENT IN ELECTRICAL REPRODUCING APPARATUS AND FADER CONTROL FOR SUCH AN ARRANGEMENT

[75] Inventor: Joachim A. Dünnebacke, Herborn, Fed. Rep. of Germany

[73] Assignee: U.S. Philips Corporation, New York, N.Y.

[21] Appl. No.: 754,099

[22] Filed: Jul. 12, 1985

[30] Foreign Application Priority Data

Jul. 21, 1984 [DE] Fed. Rep. of Germany ....... 3427000

[51] Int. Cl.[4] .............................................. H03G 3/00

[52] U.S. Cl. .................................... 381/109; 381/104; 358/133

[58] Field of Search ............... 381/104, 105, 109, 120, 381/117; 323/353; 358/130, 132, 126, 124, 123, 133, 137

[56] References Cited

U.S. PATENT DOCUMENTS

| | | | |
|---|---|---|---|
| 1,916,187 | 6/1933 | Read | 381/109 |
| 2,257,731 | 10/1941 | Coe | 381/109 |
| 2,262,757 | 11/1941 | Coe | 381/109 |
| 2,573,122 | 10/1951 | Weber | 381/109 |
| 3,184,694 | 5/1965 | Weinschel | 338/133 |
| 3,449,681 | 6/1969 | Hafler | 338/133 |
| 3,702,901 | 11/1972 | Cherry | 381/109 |
| 3,784,748 | 1/1974 | Brinkerhoff | 381/109 |
| 4,113,984 | 9/1978 | Gilbert | 381/109 |
| 4,274,074 | 6/1981 | Sakamoto | 338/171 |
| 4,363,934 | 12/1982 | Scholz | 381/109 |
| 4,435,833 | 3/1984 | Thakkar | 381/109 |
| 4,462,112 | 7/1984 | Watanabe | 381/109 |

*Primary Examiner*—Gene Z. Rubinson
*Assistant Examiner*—L. C. Schroeder
*Attorney, Agent, or Firm*—Thomas A. Briody; William J. Streeter; Marianne R. Rich

[57] ABSTRACT

The invention relates to a fading arrangement in electrical reproduction apparatus, for fading the signals supplied to two reproduction units by a signal source, comprising a variable resistor whose resistance track co-operates with wiper means which, when moved along said track, connect a fading resistance which decreases from the maximum value to the minimum value in series with one reproduction unit and a fading resistance which increases from the minimum value to the maximum value in series with the other reproduction unit. Additional variable resistors ($R_Z$) are arranged in parallel with the reproduction units ($R_{L1}$, $R_{i1}+R_{L1}$; $R_{L2}$, $R_{i2}+R_{L2}$). During the common movement of all the wiper means the additional wiper means vary the resistance values of the additional resistors ($R_2$, 100 $R_2$) oppositely, in such a way that the resistance value of the additional resistor ($R_2$) connected in parallel with one reproduction unit varies from the maximum value to a minimum value and the resistance value of the additional resistor connected in parallel with the other reproduction unit varies from the minimum value to the maximum value.

11 Claims, 10 Drawing Figures

FADER CIRCUIT ARRANGEMENT IN ELECTRICAL REPRODUCING APPARATUS AND FADER CONTROL FOR SUCH AN ARRANGEMENT

The invention relates to a fading arrangement in electrical reproduction apparatus, for fading the signals supplied to two reproduction units by a signal source, comprising a variable resistor whose resistance track co-operates with wiper means which, when moved along said track, connect a fading resistance which decreases from the maxiumum value to the minimum value in series with one reproduction unit and a fading resistance which increases from the minimum value to the maximum value in series with the other reproduction unit.

A fader control in a fader arrangement described in DE-OS No. 29 38 675 has a rotary wiper and a circular wiper track which is scanned by two wiper arms which diverge from the centre of rotation. This known fader control may alternatively be constructed as a sliding control. The wiper track is divided into two conductor-track portions between which a resistance track portion is arranged. The conductor-track portions, which are for example metallized, each have a first end which is in contact with the intermediate resistance-track portion. The wiper arms are spaced from each other in such a way that in a centre position they both contact the first ends of the conductor-track portions. If a loudspeaker is connected to each of the conductor-track portions, the full output voltage of an AF amplifier of the reproducing apparatus is applied to both loudspeakers. If the wipers are moved out of the centre position one wiper remains on a conductor-track portion and the other wiper occupies a specific position on the resistance-track portion depending on the displacement. In this way a larger or smaller fraction of the resistance of the resistance-track portion is connected in series with a loudspeaker. Thus, the voltage and hence the power applied to the loudspeaker is reduced accordingly. However, the other loudspeaker still receives the full output voltage of the output amplifier. The resistance values of the resistance-track portions of fader controls range typically between 20 and 80 ohms.

If the resistance-track portion of the fader control has a series resistance of, for example, 40 Ohms, the full output voltage of the AF amplifier is applied to both loudspeakers in the centre position of the wipers. However, if the wipers are set to an end position, one loudspeaker receives the full output voltage and the other loudspeaker only receives a voltage of $$U_2 = U_1 \times \frac{4\Omega}{40\Omega + 4\Omega},$$

i.e. 0.09×U1 or approximately one hundredth of the power applied to the other loudspeaker. In this way a satisfactory fading can be obtained.

However, the situation becomes different if the fader control is connected to a booster having an input with a comparatively high impedance (higher than 1 kohm). As a result of this high-impedance input the load presented to the fader control becomes very small and substantially negligible. In the centre position both boosters are driven with the same voltage. However, if the wiper arms are set to an end positon one booster is driven with the full voltage and the other booster is driven with a voltage of $$U_2 = U_1 \times \frac{R_2}{R_1 + R_2}.$$

If the series resistance of the resistance-track portion is again 40 Ohms, the drive voltage will be $$U_2 = U_1 \times \frac{1\ k\Omega}{1\ k\Omega + 40\Omega},$$

or $$U_2 = 0.9616 \times U_1.$$

This means that in the case of high-impedance boosters the two loudspeakers receive substantially the full output power in the extreme positions of the wiper arms. This difference is hardly measurable, let along audible. This drawback can be mitigated by the use of a low-impedance booster input of, for example, 20 Ohms, but this is at the expense of an additional loss of power in the booster and a higher distortion in the output stage which is loaded with, for example, 2×20 ohms=40 ohms.

SUMMARY OF THE INVENTION

It is the object of the invention to provide a fader arrangement and a fader control suitable for use in this arrangement, which provides a satisfactory fading control even in the case of a high-impedance booster input.

According to the invention this object is achieved in that additional variable resistors, which co-operate with additional wiper means, are arranged in parallel with the reproduciton units. The additional wiper means during the common movement of all the wiper means vary the resistance values of the additional resistors oppositely, in such a way that the resistance value of the additional resistor connected in parallel with one reproduciton unit varies from the maximum value, to a minimum value and the resistance value of the additional resistor connected in parallel with the other reproduction unit varies from the minimum value to the maximum value.

The parallel connection of additional resistors, whose resistance values vary inversely proportionally to the resistance values of the fader resistor, enables the output voltages of the fader control to be varied to a satisfactory extent independently of whether a low-impedance load (loudspeaker) or a high-impedance load (booster amplifier or headphones) is connected. Preferably, the additional resistors are continuously variable or variable in steps.

In order to realize the fader arrangement it is advantageous to use a fader control constructed as a rotary or sliding control, in which the reproduction signals are applied to different points of a wiper track by means of mutually spaced ganed fading wiper arms, which wiper track comprises two metal conductor track portions which are connected to the reproduction units and a fading-resistance track portion which is interposed between said conductor track portions, which interconnects the adjacent first ends of the conductor track portions, and which can cooperate with one of the fading wiper arms.

In accordance with the invention this fader control is characterized in that the metal conductor track portion have their second ends which are remote from each other each connected to an additional resistance track portion which cooperates with an additional wiper arm which is connected to the apparatus earth potential, and the mutually spaced fading wiper arms are electrically insulated from and mechanically connected to the additional wiper arm so as to be movable in the same direction. The distances between the wiper arms and the common displacement may be selected arbitrarily.

In a rotary fader control the additional wiper arm may, for example, be connected to the housing via the fader-control spindle and to earth via the apparatus housing. A direct earthing connection is also possible.

If two loudspeakers are connected to this fader control an additional resistance of 40 ohms is connected in parallel with each loudspeaker in the centre position of the fader control if the overall additional resistance value is 80 ohms. The influence of this additional load on the operation of the output stage is negligible. In an end position of the fader control one loudspeaker is connected directly to the output stage and the entire additional resistance of 80 ohms is connected in parallel therewith. However, the other loudspeaker is short-circuited by the additional wiper arm. This results in a satisfactory fading control when normal 4 ohm loudspeakers are employed. However, when high-impedance booster amplifiers are used the fader control is of particular importance. In the centre position the two boosters are driven with the same full output voltage of the output amplifier. The load of the output stage is then approximately 40 ohms, so that the properties of the output stage are not influenced. If the fader control is now set to an end position a similar situation is obtained, because fading always takes place from full power for one booster to a short-circuit of the other booster and the corresponding loudspeakers. In this way the fader control is both suitable for direct connection of a loudspeaker and for use with an intermediate booster amplifier.

In a further embodiment of the invention the additional resistance track portion of a rotary fade control completes the wiper track to form a completely circular track. If the conductor track length available for this is not adequate, for example because the conductor track portions together with the fading-resistance track portion cover an arc of more than 180°, it is possible, in accordance with a further embodiment of the invention, that the additional resistance track portion is arranged concentrically with the wiper track comprising the conductor track portions and the fading-resistance track portion. In the case of a sliding control the additional resistance track portion is arranged parallel to a rectilinear wiper track comprising conductor track portions and a fading resistance track portion.

In accordance with a further embodiment of the invention an even better adaptation of the additional resistance to a specific situation may be obtained in that the resitance variation over the additional resistance track portion is non-linear.

If the additional resistance track portion is connected between the conductor track portions the continuously flowing current will lead to a loss of power. In order to reduce the power loss, in accordance with a further embodiment of the invention, the additional resistance track portion is interrupted in its centre to form two separate track portions and the additional wiper arm is insulated when it cooperates with this interruption.

Embodiments of the invention will now be described in more detail, by way of example, with reference to the accompanying drawings.

DESCRIPTION OF THE PREFERRED EMBODIMENT

Figure 1:
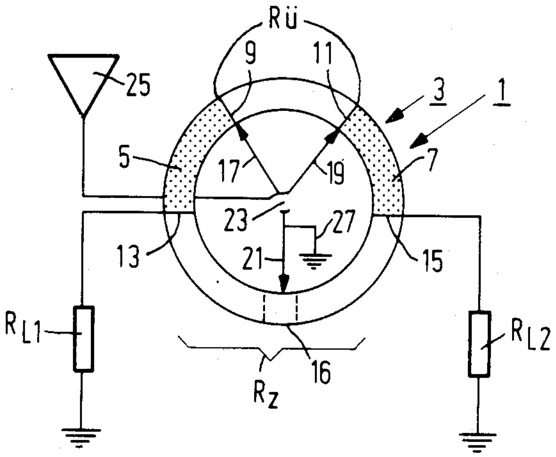
FIG. 1 shows a fader control with fading-resistance and additonal resistance track portions.

FIG. 1 shows schematically a fader control 1 for a fader arrangement in electrical reproducing apparatus for fading the electrical reproduction signals applied to a first reproduction unit and a second reproduction unit. The arrangement shown is intended for mono operation, i.e. for single-channel operation. For stereo operation the fader control should be duplicated. The reproduction units may be loudspeakers which are connected directly, or loudspeaker or headphones which are connected via booster amplifiers. Further, the fader control need not necessarily be a rotary fader control. The fader control may alternatively be a sliding control as described with reference to FIG. 6. The fader control 1 shown in FIG. 1 has a wiper track 3, which is divided into a plurality of track portions. The wiper track comprises two metal conductor tracks portions 5 and 7. Reproduction units in the form of loudspeakers, represented as load resistors $R_{L2}$, are connected to these metal conductor tracks portions 5, 7. The loudspeakers are connected to earth. A fading-resistance track portion $R_U$ is interposed between the first end 9 and 11 of the conductor track portions 5 and 7. The fading-resistance track portion $R_U$ is in contact with the metal conductor track portions 5 and 7. An additional resistance track portion $R_Z$ is connected to the second ends of the conductor track portions 5 and 7 and completes the annular wiper track 3. The resistance variation along the additional resistance track portion $R_Z$ may be linear or non-linear. A variation in steps is also possible. The additional resistance track portion $R_Z$ may be divided into two separate additional resistance track portions $R_{Z1}$ and $R_{Z2}$ by an insulating portion 16 in the centre, in order to reduce the loss of power.

The wiper track 9 can cooperate with wiper arms 17, 19 and 21. The range of rotation is limited to ±90° relative to the wiper-arm position in FIG. 1. The wiper arms 17 and 19 are electrically interconnected and diverge relative to each other and are electrically insulated from the wiper arm 21. All the wiper arms are movable about the centre 23 of the wiper track 3 by means of a common spindle. In the drawings the centres or rotation of the wipers are shown shifted relative to the centre 23 of the wiper track in order to illustrate that the wiper arms 15, 17 are electrically insulated from the wiper arm 21.

The wiper arms 17 and 19 are connected to an output amplifier of an electrical reproduction apparatus. They are only movable over their associated conductor track portions 5 and 7 and the fading resistance track portion $R_U$. The wiper arm 21 can only cooperate with the additional resistance track portion $R_Z$. The wiper arm 21 is earthed, for example via the mental spindle and the housing of the fader control. In FIG. 1 this earthing is represented by an earthing line 27. However, alternative earthing methods, for example via additional wipers, are conceivable.

Figure 2:
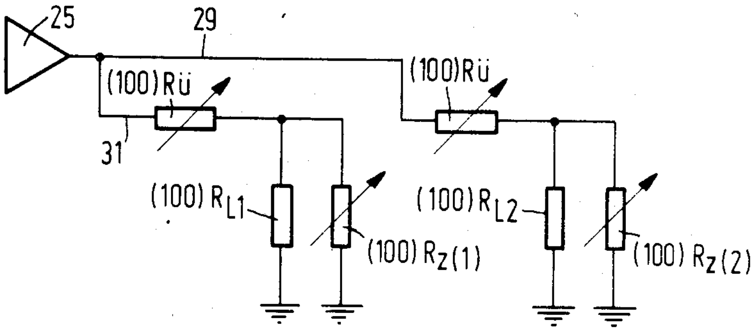
FIG. 2 is an equivalent circuit diagram of a circuit arrangement in which the fader control of FIG. 1 is used.

FIG. 2 shows the equivalent circuit diagram of a fader control 1 used in a fading arrangement. The equivalent circuit diagram 25 shows that the electrical reproduction signals, for example speech or music, are applied to the load via parallel lines 29, 31 and a divided fading resistor $R_U$. The load is constituted by the parallel arrangement of the loudspeaker resistances $R_{L1}$ and $R_{L2}$ and a part of the additional resistance $R_Z$. Thus, a part of the additional resistance $R_Z$ is connected in parallel with the loudspeaker resistance $R_{L1}$ and the remainder of the additional resistance $R_Z$ is connected in parallel with the loudspeaker resistance $R_{L2}$. If there is provided an insulating portion 16, the electrically isolated additional resistance track portions are referred to as $R_{Z1}$ and $R_{Z2}$.

Figure 3A:
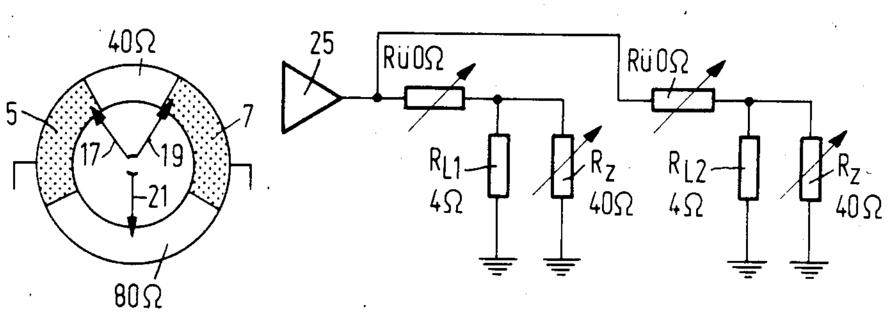
FIGS. 3*a*–3*c* show three equivalent circuit diagrams of fader arrangements comprising the fader control of Fig. 1 in three different positions, for the direct connection of loudspeakers.
Figure 3B:
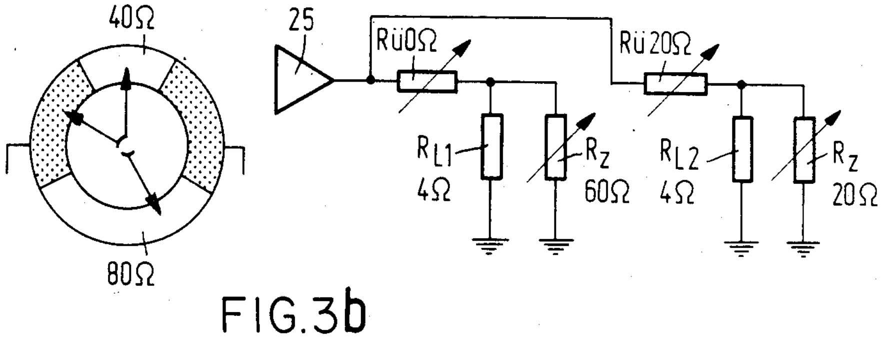
Figure 3C:
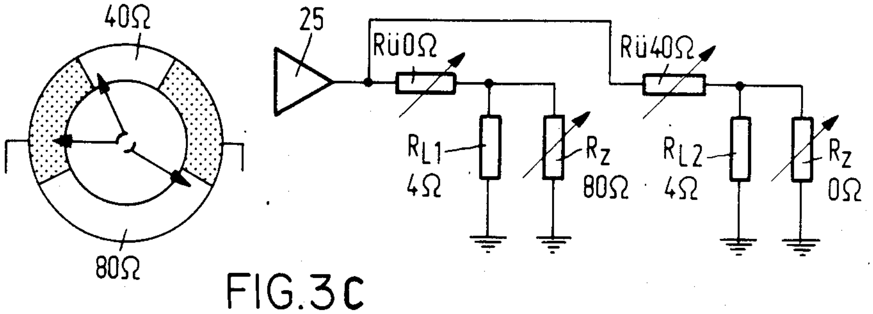

FIG. 3 shows show the fader control operates by means of three diagrams illustrating the fader-control positions and three associated equivalent circuit diagrams. The Figure only shows the situation for an anticlockwise rotation of the wiper arm from the centre position to an end position. The fading resistance for the loudspeaker having a resistance $R_{L2}$ increases from 0 ohms to 40 ohms, whilst at the same time the additional resistance decreases from 40 ohms to 0 ohms. In a similar way, the additional resistance $R_Z$, connected in parallel with the resistance $R_{L1}$, increases from 40 ohms to 80 ohms. Thus, the fading resistance $R_U$ and the additional resistance $R_Z$ vary oppositely or inversely proportionally in the individual lines 29 and 31.

The specified resistance values are based on the fact that the fading resistance $R_U$ over the entire length of the fading-resistance track portion is 40 ohms. The additional resistance $R_Z$ over the entire additional resistance track portion $R_Z$ is 80 ohms. For the resistance values, the resistance ratios change accordingly.

Figure 4A:
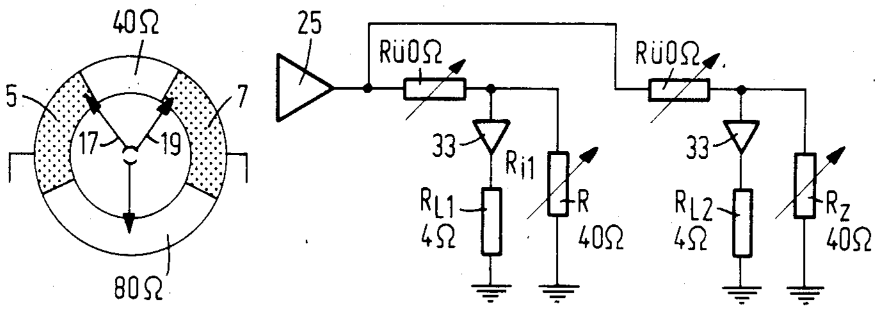
FIGS. 4*a*–4*c* show three equivalent circuit diagrams of fader arrangements comprising the fader control of FIG. 1, for loudspeakers connected via a booster amplifiers.
Figure 4B:
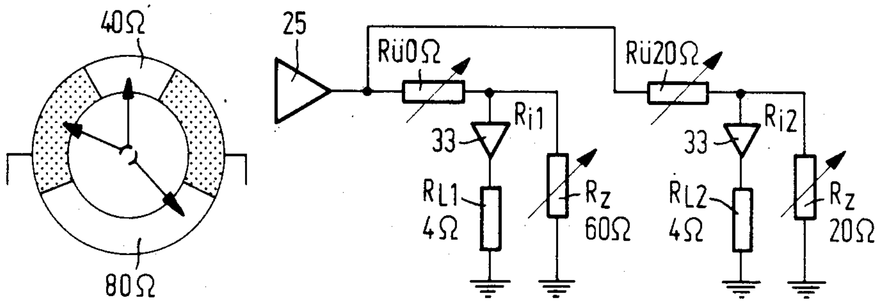
Figure 4C:
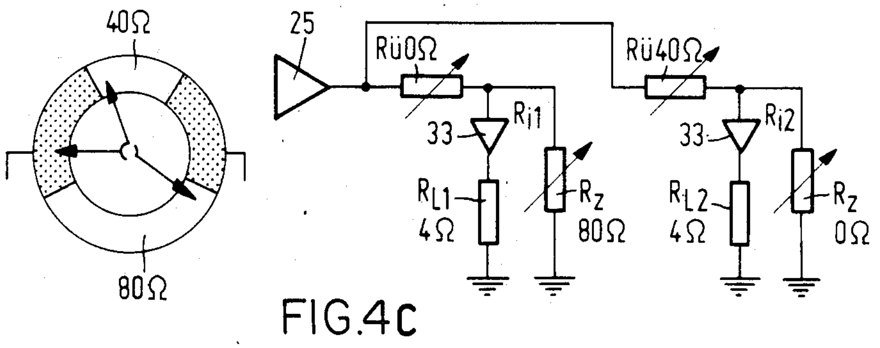

In the situation shown in FIGS. 4_a_ to 4_c_ the fading resistance is again 40 ohms and the additional resistance is again 80 ohms. Again these resistance values are only given by way of example. Each of the loudspeaker resistances $R_{L1}$ and $R_{L2}$ is preceded by a booster amplifier 33 having an internal resistance $R_{I1}$ or $R_{I2}$. The three settings again correspond to those in FIGS. 3_a_ to 3_c_ and the fading resistances and the additional resistances also vary in the same way as in FIGS. 3_a_ to 3_c_. The only difference is the inclusion of the boosters 33 with the internal resistances $R_{I1}$ and $R_{I2}$.

It is found that a satisfactory fading control can be obtained both in the case of a direct connection of loudspeakers and in the case of the inclusion of booster amplifiers.

Figure 5:
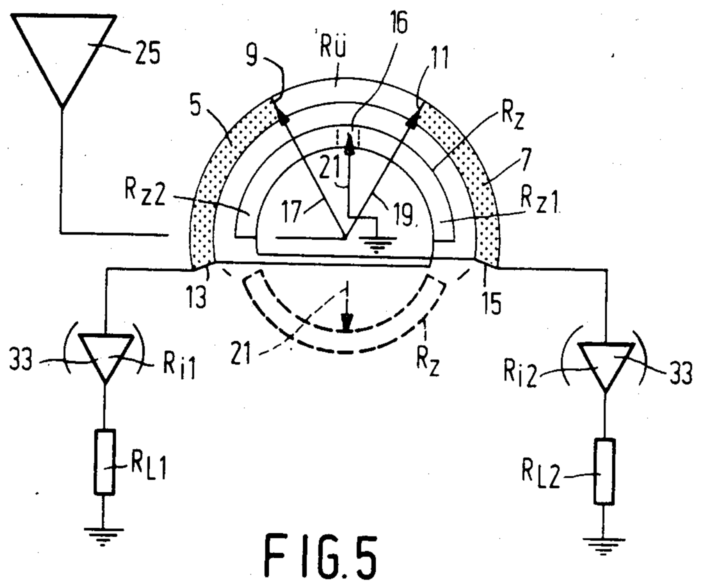
FIG. 5 shows a modification of the fader control shown in FIG. 1, comprising coaxial additional resistance track portions.

FIG. 5 shows a fader control in which the additional resistance track portion $R_Z$ does not complete the wiper track to a ring, but is arranged coaxially with this track. Again the additional resistance track portion may be divided into two mutually insulated portions by means of an insulating portion 16. The additional resistance track portion $R_Z$ or the additional resistance track portions $R_{Z1}$ and $R_{Z2}$ are cross-coupled in order to obtain the same direction of rotation for all the wiper arms.

As a modification of this embodiment it is alternatively possible to arrange the coaxial additional resistance track portion $R_Z$ at the lower side in the same way as in FIG. 1 and as indicated by the broken lines in FIG. 5. The additional resistance track portion $R_Z$ or the additional resistance track portions $R_{Z1}$ and $R_{Z2}$ are then not cross-coupled. In the embodiment shown in FIG. 5 the additional wiper arm 21 is situated in the centre between the fading wiper arms 17, 19. In the embodiment shown in FIG. 1 and when the coaxial additional resistance track portion is inverted relative to the situation shown in FIG. 5, the additional wiper arm 21 is shifted 180° relative to the central position between the wiper arms 17, 19.

Figure 6:
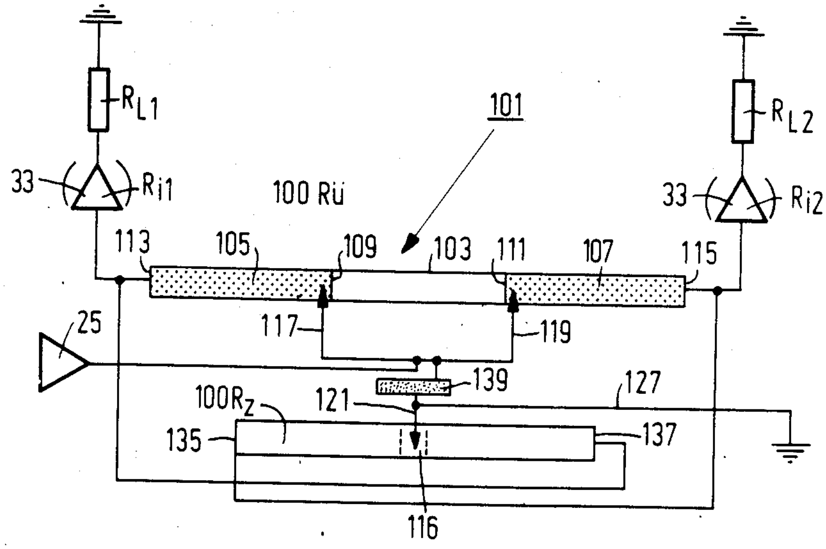
FIG. 6 shows a fader control constructed as a sliding control comprising an additional resistance track.

FIG. 6 shows a fader control 101 constructed as a sliding control and comprising a straight additional resistance track portion 100 $R_Z$, which cooperates with an additional wiper arm 121. A straight wiper track 103 extends parallel to the additional resistance track portion 100 $R_Z$, and comprises outer metal conductor track portions 105, 107 and an associated fading resistance track portion 100 $R_U$. The wiper track 103 is scanned by means of electrically interconnected and mutually spaced wiper arms 117, 119. The distance between the wiper arms 117, 119 is slightly larger than the length of the fading resistance track portion 100 $R_U$, so that the two wiper arms are situated on the associated conductor track portions 105 and 107 in the centre position of the control.

The first ends 109, 111 of the conductor track portions 105, 107 are in contact with the interposed fading track portion 100 $R_U$. The second ends 113, 115 of the conductor track portions 105, 107 are connected to reproduction units, comprising the loudspeakers $R_{L1}$ and $R_{L2}$ or these loudspeakers preceded by high-impedance boosters $R_{i1}$ and $R_{i2}$. The wiper arms 117, 119 which cooperate with the wiper track 103 are electrically connected to the output amplifier 25 of the apparatus and the additional wiper arm is connected to the apparatus earth via the line 127. The end 135 of the additional resistance track portion 100 $R_Z$ which extends parallel to the second end 113 of the conductor track portion 105 is connected to the second end 115 of the conductor track portion 107. Similarly, the end 137 of the additional resistance track portion 100 $R_Z$ which extends parallel to the second end 115 is connected to the second end 113 of the conductor track portion 105.

All the wiper arms 117, 118 and 121 are mechanically connected to a slider knob 130. The wiper arms 117, 119 are electrically insulated from the wiper arm 121. The sliding control shown in FIG. 6 operates in the same way as the fader control shown in FIGS. 1 and 5. The same applies to that in FIGS. 2, 3 and 4. Again an insulating portion 116, shown in broken lines in FIG. 6, may be arranged in the centre of the additional resistance track portion 100 $R_Z$ to divide it into two electrically insulated portions 100 $R_{Z1}$ and 100 $R_{Z2}$. In the centre position shown in FIG. 6 the additional wiper arm 121 should be situated on this insulated portion 116.

What is claimed is:

1. A fading circuit in an electrical reproduction apparatus for fading the signals applied to first and second reproduction units comprising:

a variable resistor having first and second ends of a resistance element connected to said first and second reproduction units, respectively, and having a movable wiper means which, when moving along said resistance element in a first direction, forms a fading resistance which decreases from a maximum to a minimum value in series with said first reproduction unit, and a fading resistance which increases in resistance from a minimum to a maximum in series with said second reproductions unit; and an additional variable resistor having a wiper means coupled with said first variable resistor wiper means, said additional variable resistor means providing first and second variable resistances in parallel with said first and second reproduction units, said first variable resistance increasing from a minimum to a maximum while said second variable resistance decreases from a maximum to a minimum when said first variable resistor wiper means moves in said first direction.

2. A fading arrangement as claimed in claim 1, wherein reproduction units comprise loudspeakers ($R_{L1}$, $R_{L2}$) or loudspeakers ($R_{L1}$, $R_{L2}$) in series with booster amplifiers (33).

3. A fader control for fading an electrical signal applied to first and second reproduction units comprising:

a wiper track having first and second separated metal conductor track portions connected to respective of said first and second reproduction units;

a fading resistance element disposed between said metal conductor track portions;

first and second mutually spaced wiper arms for providing a movable contact with said fading resistnce element, said wiper arm connected to receive a signal to be faded;

a second additional wiper track having a resistance element connected between said first and second metal conductor track portions; and an additional wiper arm mechanically coupled to said first and second wiper arms providing a movable contact with said additional wiper track, and connected to a common connection of said first and second reproduction units.

4. A fader control as claimed in claim 3, wherein the resistance value measured along the fading resistance track portion ($R_U$, 100 $R_U$) is approximately half the resistance value of the second additional resistance track portion ($R_Z$).

5. A fader control as claimed in claim 3, wherein the resistance value measured across the fading resistance track portion ($R_U$, 100 $R_U$) is approximately 30 to 50 ohms and the corresponding resistance value of the second additional resistance track ($R_Z$, 100 $R_Z$) is between 70 and 90 ohms.

6. A fader control as claimed in claim 3, wherein the second additional resistnace track portion is concentric with the first wiper track comprising the conductor track portions and the fading resistance.

7. A fader control as claimed in claim 3, wherein the resistance variation over the additional resistance track portion is non-linear.

8. A fader control as claimed in claim 3, wherein the additional resistance is interrupted in its centre to form two separate track portions in such a way that the additional wiper arm is insulated when it cooperates with this interruption.

9. The fader control of claim 3, wherein said first wiper track, fading resistance element and second additional wiper track form an annular track.

10. The fader control of claim 3, wherein said wiper track and fading resistance are disposed along a line, and said second additional wiper track is disposed along a line parallel to said first wiper track and fading resistance.

11. A fading circuit arrangement for applying a faded signal to first and second reproduction units comprising:

a first variable resistor including:

first and second separated conductor elements connected by a fading resistor element, said first and second conductor elements connected to a respective reproduction unit;

a first movable wiper arm having two spaced apart wiper elements for contacting in a central position each of said conductor elements, and movable in first and second directions away from said central position to increase the resistance between said wiper arm and one or the other of said reproduction units; and A second variable resistor comprising a second resistance element connected to said first and second conductor elements, and having a second wiper arm electrically connected to a common connection of said first and second reproduction units, said second wiper arm coupled to move with said first movable wiper arm for reducing the resistance across a reproduction unit as the resistance between said reproduction unit and said first wiper arm increases.

* * * * *

UNITED STATES PATENT AND TRADEMARK OFFICE
CERTIFICATE OF CORRECTION

PATENT NO. : 4,682,364

DATED : July 21, 1987

INVENTOR(S) : Joachim A. Dunnebacke

It is certified that error appears in the above-identified patent and that said Letters Patent is hereby corrected as shown below:

Col.8, Claim 8, line 2 after "resistance" insert --track portion--

Signed and Sealed this

Twenty-ninth Day of May, 1990

*Attest:*

HARRY F. MANBECK, JR.

*Attesting Officer* *Commissioner of Patents and Trademarks*